US011153690B2

(12) United States Patent
Kuperschmidt et al.

(10) Patent No.: US 11,153,690 B2
(45) Date of Patent: Oct. 19, 2021

(54) ELECTROSTATIC SPEAKER AND A METHOD FOR GENERATING ACOUSTIC SIGNALS (71) Applicant: DSP Group Ltd., Herzeliya (IL)

(72) Inventors: Haim Kuperschmidt, Or Yehuda (IL); Gabriel Seiden, Rehovot (IL); Igor Sokolov, Herzliya (IL); Aviad Zamir, Tel-Aviv (IL)

(73) Assignee: DSP GROUP LTD., Herzliya (IL)

( * ) Notice: Subject to any disclaimer, the term of this patent is extended or adjusted under 35 U.S.C. 154(b) by 19 days.

(21) Appl. No.: 16/525,919

(22) Filed: Jul. 30, 2019

(65) Prior Publication Data
US 2020/0236469 A1 Jul. 23, 2020

Related U.S. Application Data (60) Provisional application No. 62/839,778, filed on Apr. 29, 2019, provisional application No. 62/721,126, filed on Aug. 22, 2018.

(51) Int. Cl.
*H04R 19/02* (2006.01)
*B81C 1/00* (2006.01)
*H04R 7/04* (2006.01)
*H04R 19/01* (2006.01)

(52) U.S. Cl.
CPC .......... *H04R 19/02* (2013.01); *B81C 1/00158* (2013.01); *H04R 7/04* (2013.01); *H04R 19/013* (2013.01); *H04R 2201/003* (2013.01)

(58) Field of Classification Search
CPC ............ H04R 2201/003; H04R 19/005; H04R 19/02; H04R 19/013; H04R 7/04; B81C 1/00158
See application file for complete search history.

(56) References Cited

U.S. PATENT DOCUMENTS

| 2010/0212432 A1* | 8/2010 | Kasai | H04R 19/005 73/654 |
| 2012/0148071 A1* | 6/2012 | Dehe | H04R 1/005 381/116 |
| 2016/0277838 A1* | 9/2016 | Kupershmidt | H04R 31/00 |

* cited by examiner

Primary Examiner — Sunita Joshi
(74) Attorney, Agent, or Firm — Reches Patents (57) ABSTRACT A micro-electro-mechanical system (MEMS) electrostatic speaker that comprises an array of cells, wherein each cell comprises an upper stator, a membrane, a lower stator and supporting elements configured to support the upper stator, the membrane and the lower stator; wherein a distance between the upper stator and the lower stator of each cell is of microscopic scale.

25 Claims, 13 Drawing Sheets

ELECTROSTATIC SPEAKER AND A METHOD FOR GENERATING ACOUSTIC SIGNALS

CROSS REFERENCE

This application claims priority from U.S. provisional patent 62/721,126 filing date Aug. 22, 2018 and from U.S. provisional patent 62/839,778 filing date Apr. 24, 2018.

BACKGROUND

Electrostatic speakers exhibit distortion up to two orders of magnitude lower than conventional cone drivers, exhibit a very good frequency response, both in amplitude and phase, may use a light diaphragm which is driven across its whole surface and have a higher efficiency than other speakers.

On the other hand—electrostatic speakers are large and costly.

There is a growing need to provide a compact and cost effective electrostatic speaker.

SUMMARY

There may be provided an efficient, compact, and high performance electrostatic speaker.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Any reference in the specification to a system should be applied mutatis mutandis to a method that can be executed by the system.

Because the illustrated embodiment or embodiments of the present invention may for the most part, be implemented using micro-electro-mechanical system (MEMS) components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

There is provided a MEMS electrostatic speaker that is compact, cost effective and of improved performance.

The MEMS electrostatic speaker may include multiple cells.

Figure 1:
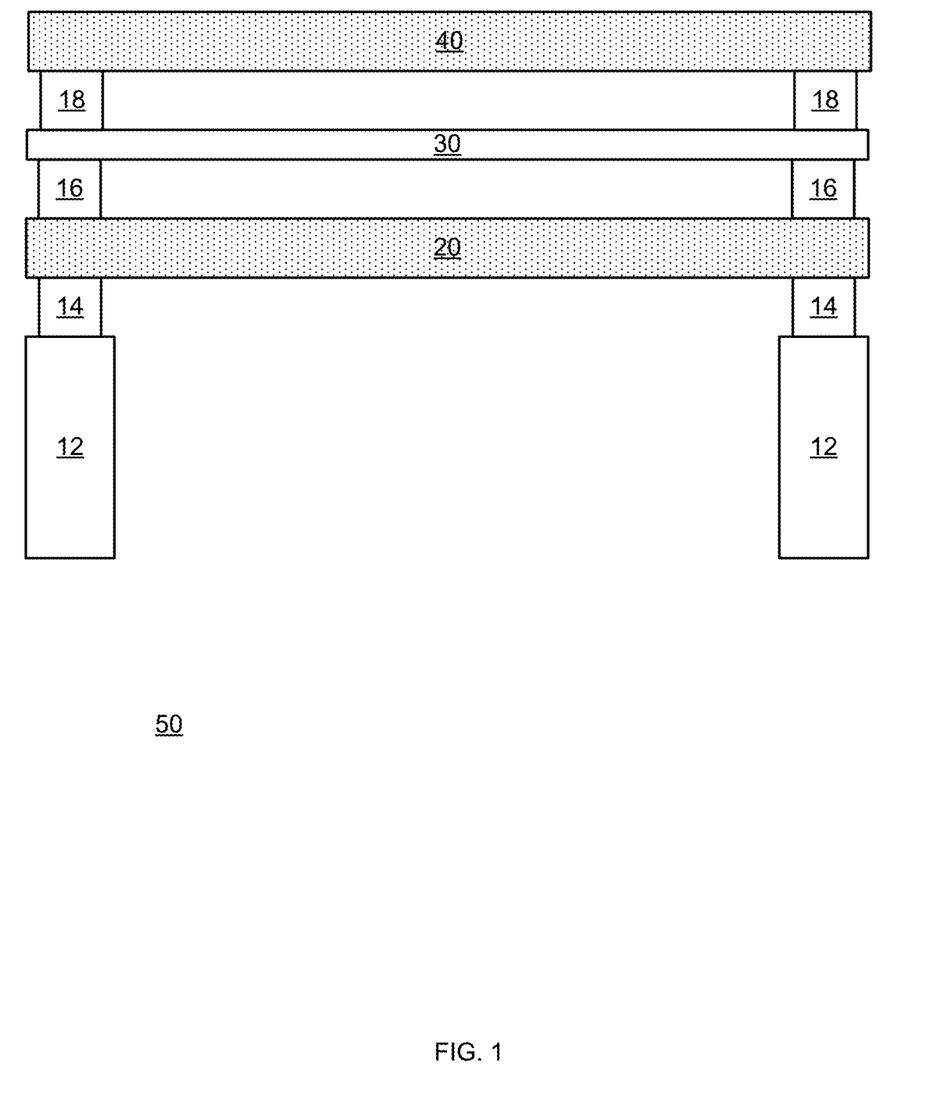
FIG. 1 illustrates an example of a cross section of a cell.

FIG. 1 illustrates an example of a cell 50 of a MEMS electrostatic speaker. The MEMS electrostatic speaker includes an array of cells. Each cells may include an upper stator 40, a membrane 30, a lower stator 20 and supporting elements configured to support the upper stator 40, the membrane 30, and the lower stator 20. From bottom to top the supporting elements are denoted 12, 14, 16 and 18.

The distance between the upper stator and the lower stator of each cell is of microscopic scale. Microscopic scale means between less than 1 micron till below a certain number of microns (for example 2, 4, 6, 10, 20, 30, 40, 50, 60, 70, 80 or 90 microns).

The distance between the lower stator and the substrate is of microscopic scale and may range, for example, between four and six microns.

The distance between the lower stator and the membrane is of microscopic scale and may range, for example, between four and six microns.

The distance between the upper stator and the membrane is of microscopic scale and may range, for example, between four and six microns.

The thickness of the lower stator is of microscopic scale and may exceed two microns—for example may range between two and four microns—and especially three micron.

The thickness of the upper stator is of microscopic scale and may exceed two microns—for example may range between two and four microns—and especially three micron.

The thickness of the membrane of microscopic scale and may range between 0.1 and two microns.

These dimensions may provide a cost effective, compact MEMS electrostatic speaker that may generate SPL that exceeds one hundred dB, and may be operated using low voltages (for example between ten and twenty volts). The mentioned above dimensions are merely non-limiting examples of dimensions.

Examples of supporting elements may be found in U.S. patent application Ser. No. 15/072,379 and in U.S. patent application Ser. No. 15/071,230—both incorporated herein by reference.

The MEMS electrostatic speaker may operate in various manners. For example—it may be fed with a certain maximum voltage Vmax The membrane is charged with charge Q=C*Vmax, where C is the capacity of the membrane relative to the two stators kept under V=0

The substrate may be kept at V=0.

Actuating signals that represent audio may be fed to the stators, in one of the following manners:

One of the stators (for example lower stator) is kept at V=0, while the second stator (for example—the upper stator) is fed by the voltage (Signal) representing the Audio signal.

Amp<Signal<+Amp.
For Signal>0: V_LowerStator=0, V_UpperStator=Vmax* (Signal/Amp). For Signal<=0: V_UpperStator=0, V_LowerStator=Vmax*(-Signal/Amp)

Yet for another example there may be provided a "push pull" mode where one of the stators may push the membrane towards the other stator:

Signal>0: V_UpperStator=Vmax*(Signal/Amp), V_LowerStator=-V_UpperStator, For Signal<=0: V_LowerStator=Vmax*(-Signal/Amp), V_UpperStator=-V_LowerStator In a cell a portion of an area of the upper stator is perforated. The portion may span along an area that is a part (for example 5, 10, 15, 20, 25, 30, 35, 40, 45, 50, 55, 60, 65, 70, 75, 80, 85, 90, 95 percent and even more) of the area of the upper stator.

The perforated area may be perforated with holes that may be of diameter (in case of a rounded holes) of between below one micron and below some tens of microns. For example—between 1 and 50 microns—or any subrange within the range of 1-50 microns.

Holes that are not circular may have width and/or length of microscopic range.

The holes may be of the same shape and/or of the same size.

At least one hole may differ by shape and/or size from another hole.

There may be a ratio between (a) an aggregate size of holes and (b) an area of the upper stator—that may range between below 0.1—and till 1. For example—the ratio may range between 0.2 and 0.8 or be within any sub-range within the range of 0.2 and 0.8.

The lower stator may also be perforated—at least in part.

The lower stator may be perforated at in the same manner (for example number of holes, location of holes, sizes of holes, shape of holes, spatial distribution of holes, and the like) that the upper stator is perforated or may be perforated at a different manner.

One or more signals that represent audio may be fed to at least one of the upper stator and the lower stator. The difference between the voltage of the upper stator and the lower stator caused the membrane to move between the upper and lower stator and generate audio signals.

The membrane and the stators can be made from various materials—for example from either from PolySi or metal (e.g. Aluminum).

Figure 2:
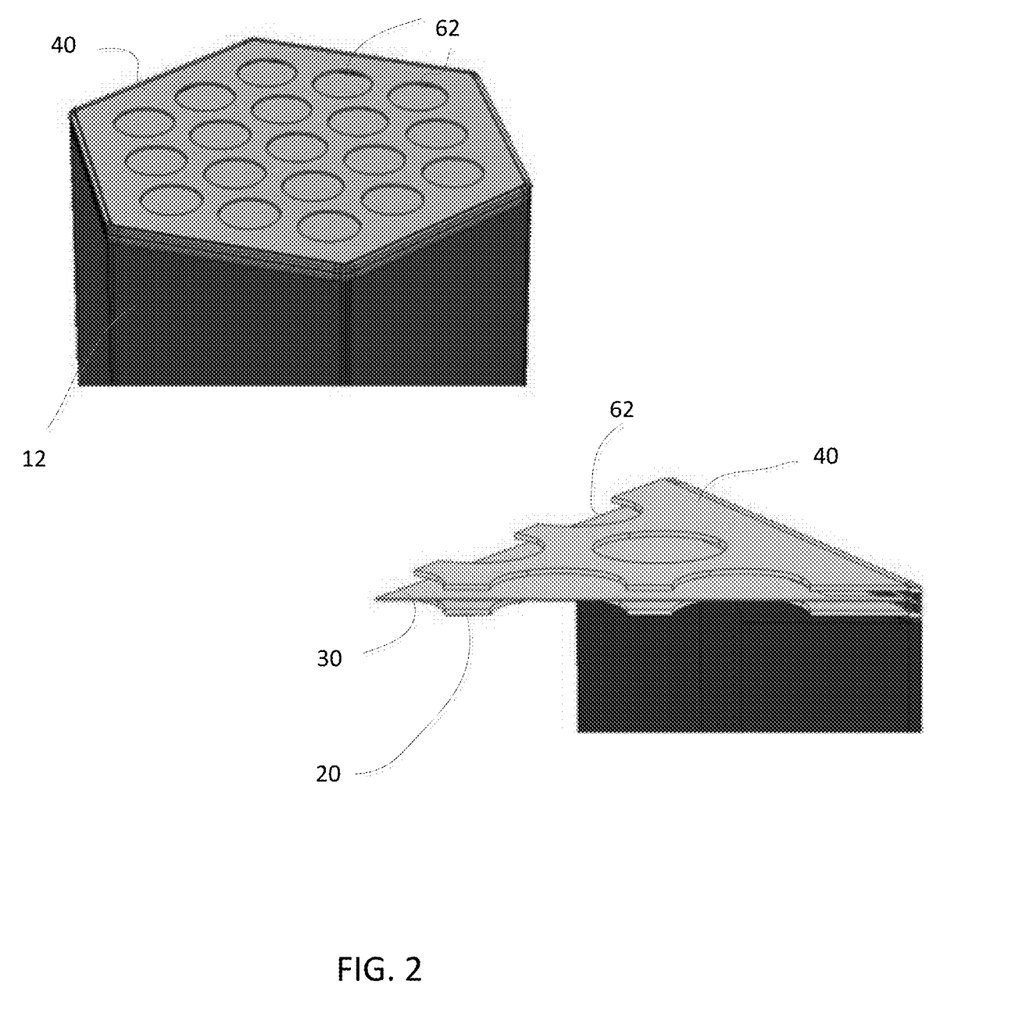
FIG. 2 illustrates an example of a cell.
Figure 3:
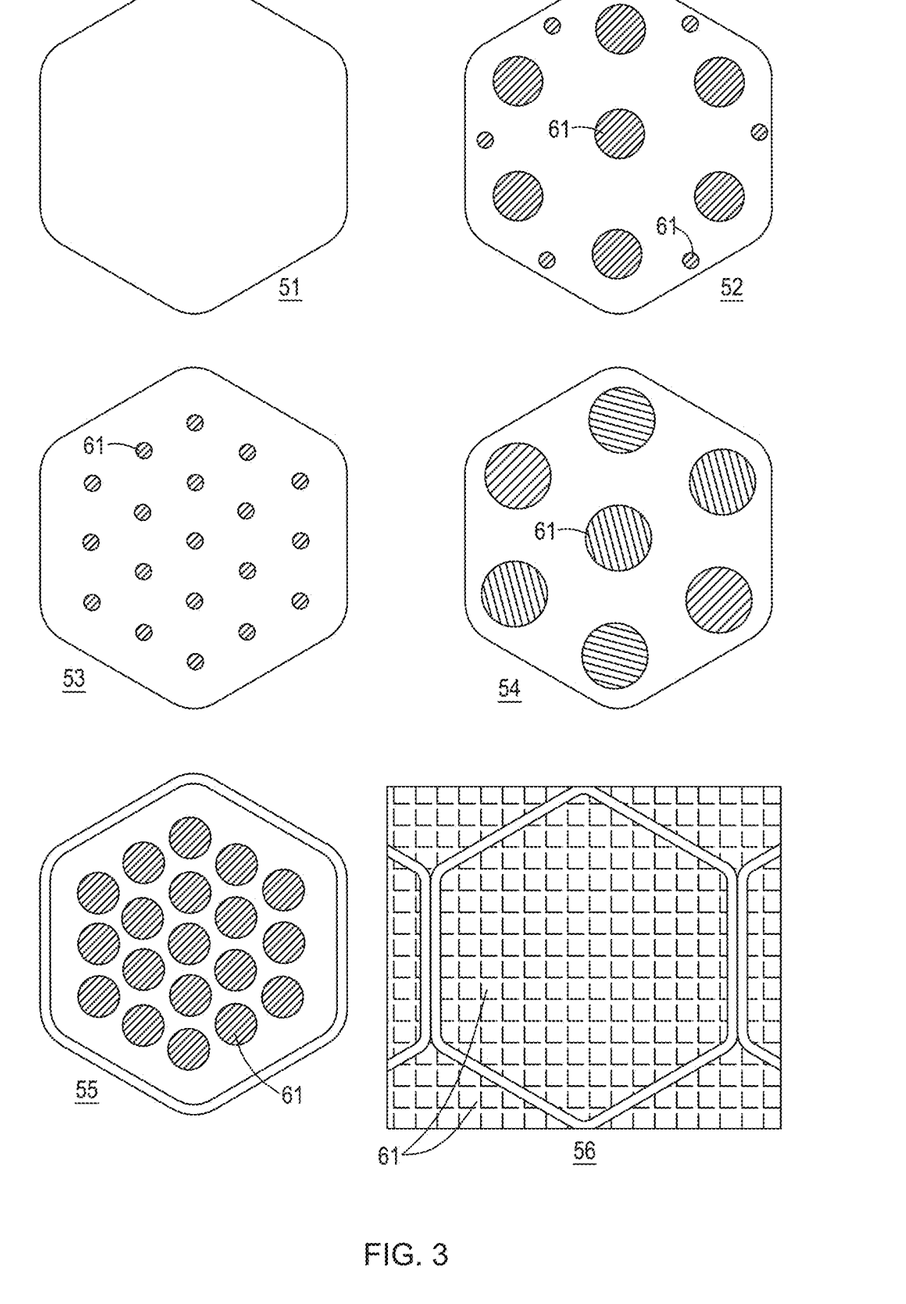
FIG. 3 illustrates examples of elements of the cell.

FIG. 2 illustrates an example of a cell 50 of a MEMS electrostatic speaker. The MEMS electrostatic speaker includes an array of cells. Each cells may include an upper stator 40, a membrane 30, a lower stator 20 and supporting elements configured to support the upper stator 40, FIG. 3 illustrates an example of elements of cells.

Cell 51 is illustrated as having sidewalls but for simplicity of explanation no membrane or stator are shown.

Upper or lower stators (hereinafter—stators) 52, 53, 54, 55 and 56 illustrate different distributions of holes 61 as well as holes of different sizes.

Figure 4:
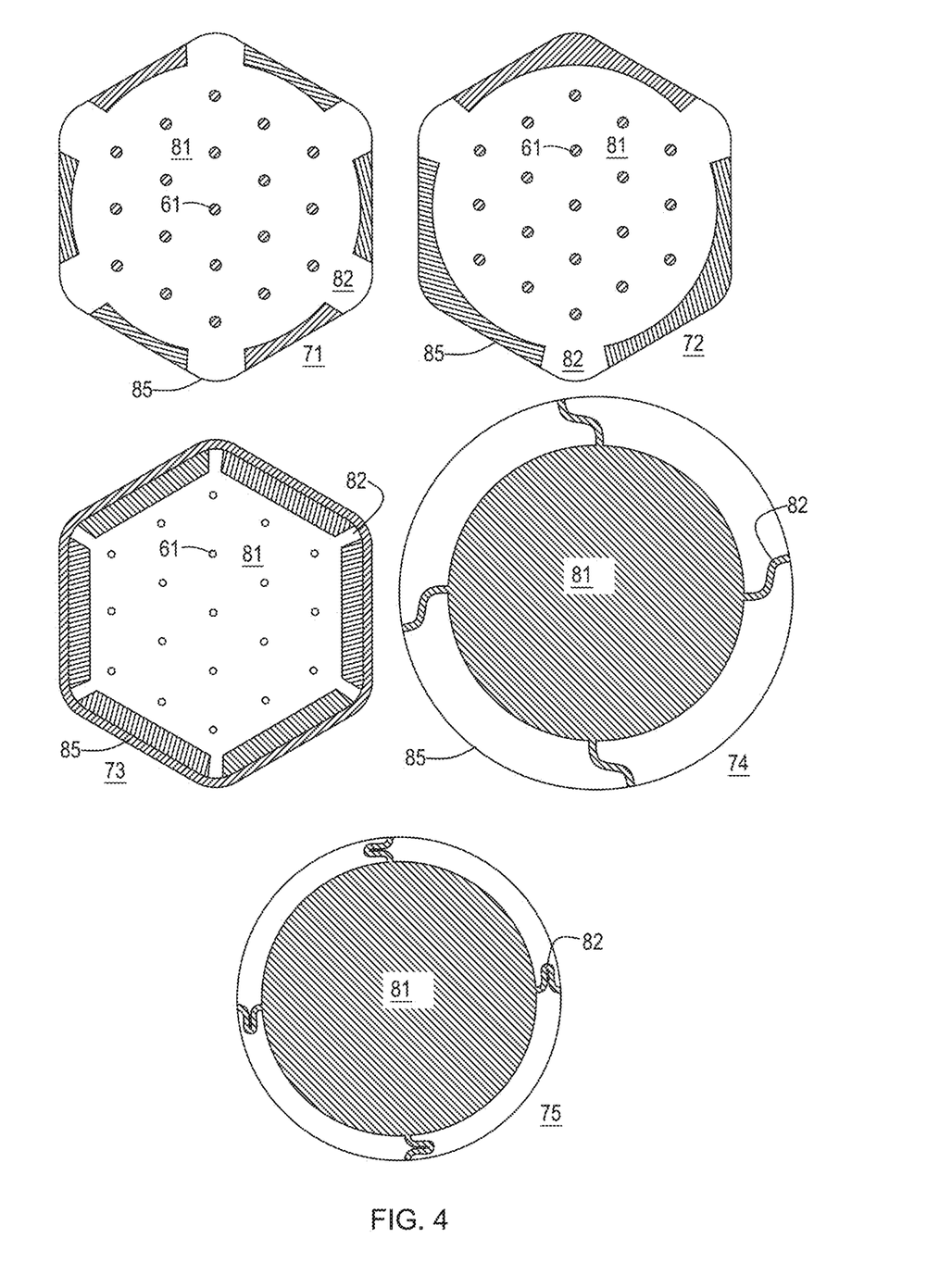
FIG. 4 illustrates examples of elements of the cell.
Figure 5:
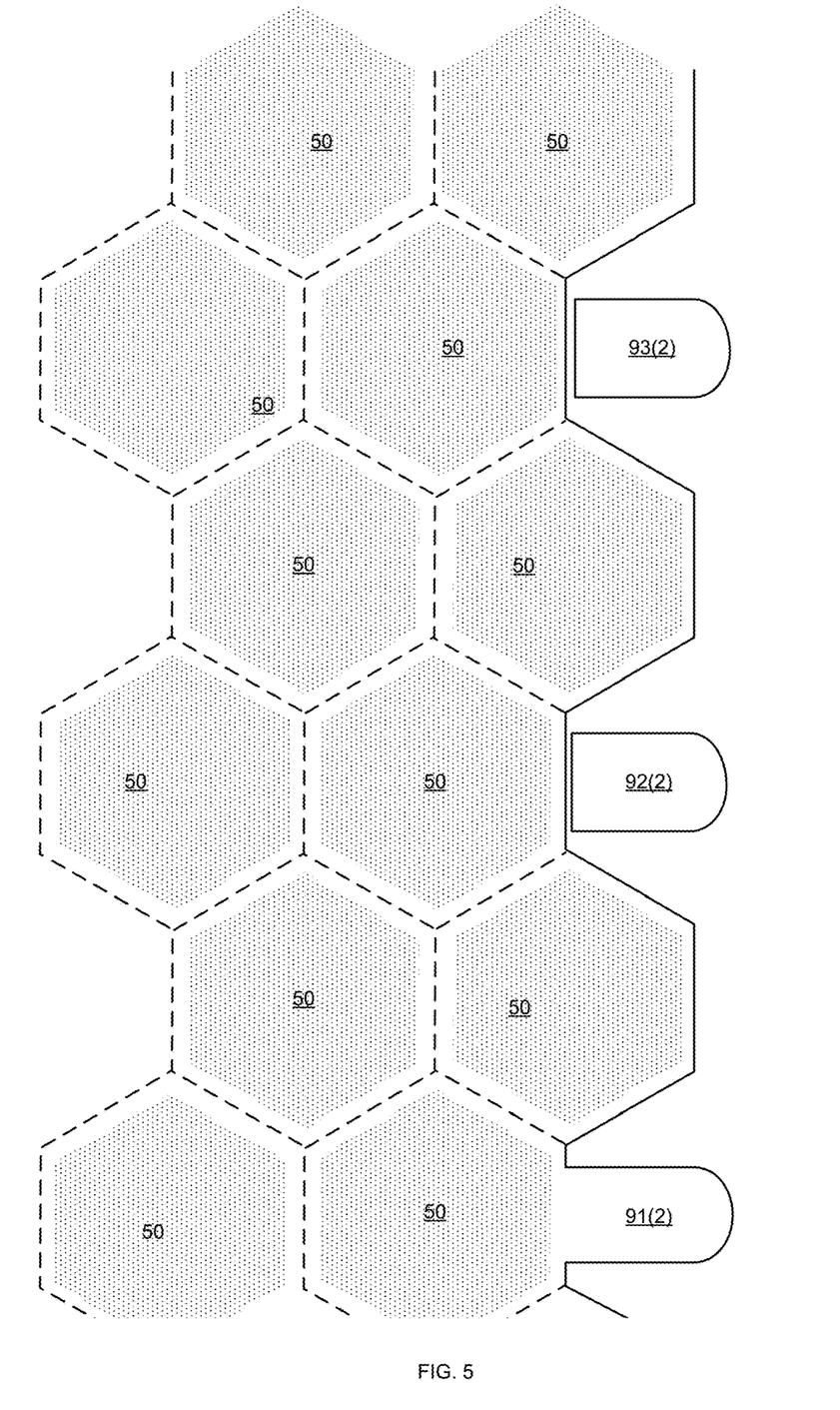
FIG. 5 illustrates an example of cells, a lower stator contact and parts of the membrane and the upper stator support structures.
Figure 6:
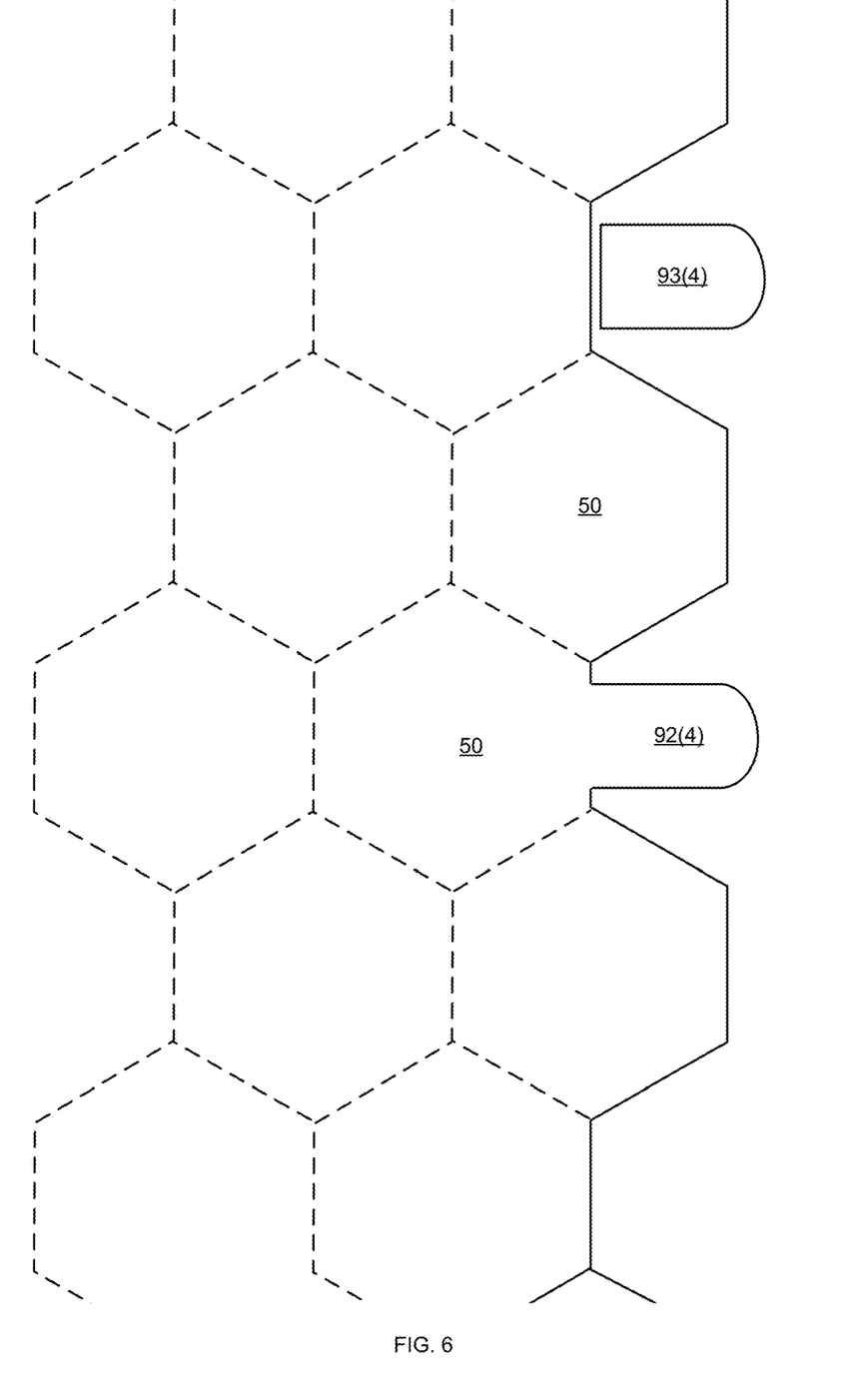
FIG. 6 illustrates an example of cells, a membrane contact and a part of the upper stator support structure.
Figure 7:
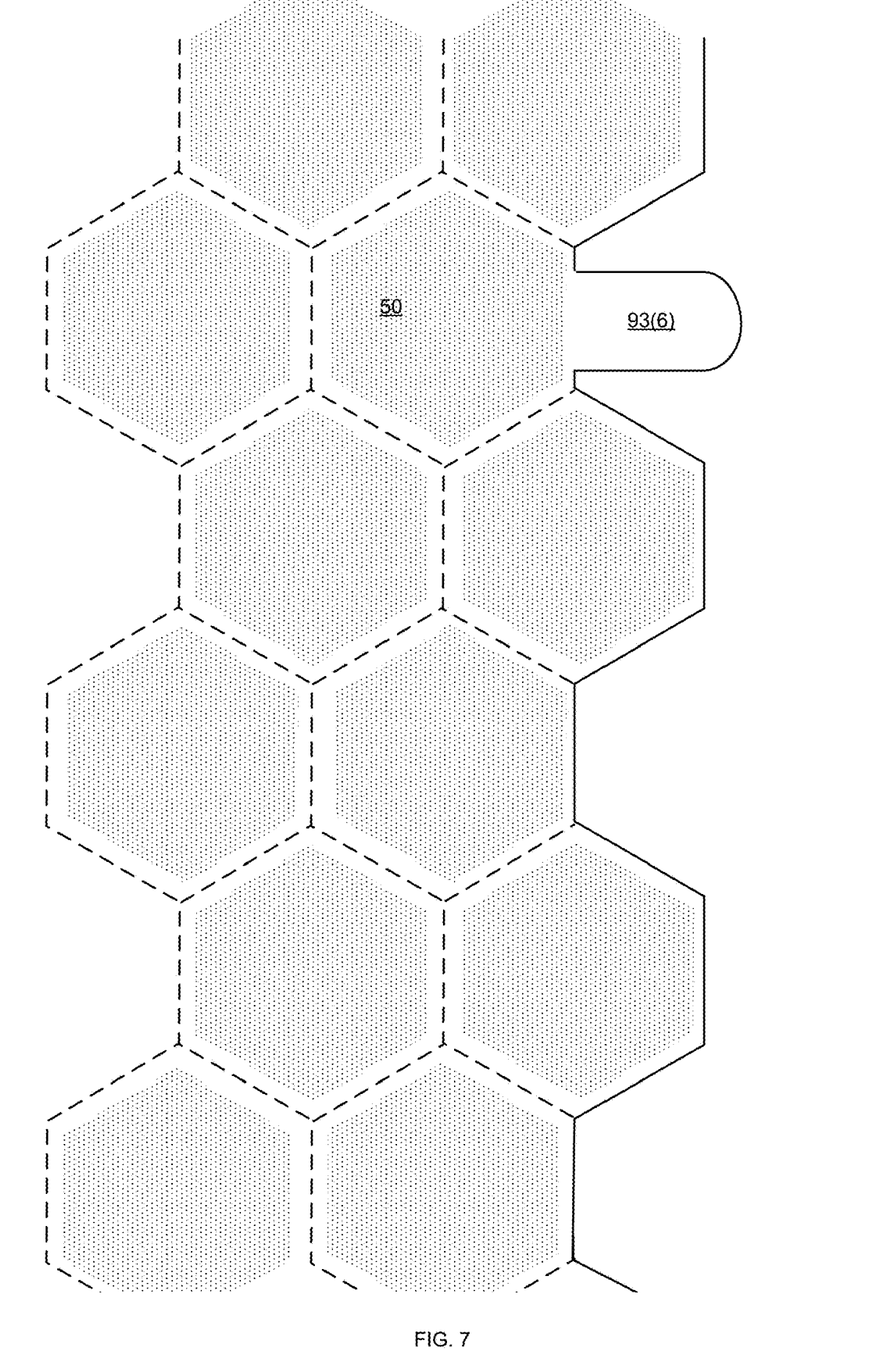
FIG. 7 illustrates an example of cells and an upper stator contact.
Figure 8:
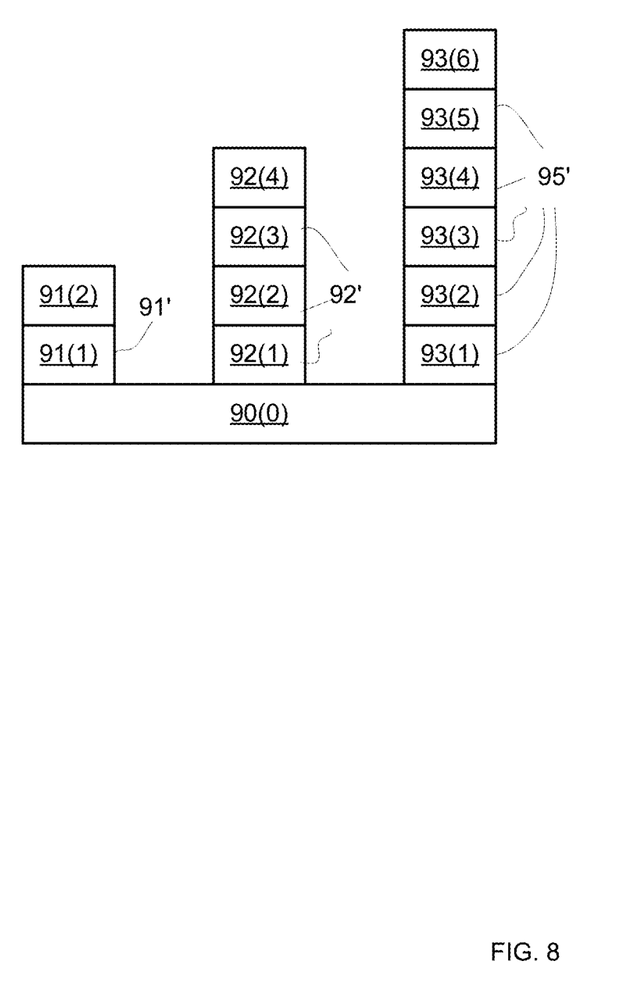
FIG. 8 illustrates an example of lower stator, membrane and upper stator contacts, as well as lower stator, membrane and upper stator support structures.

FIG. 4 illustrates an example of elements of cells.

Membranes 75 and 74 have S-shaped or U-shaped springs respectively (82) that mechanically couple a body 81 to the supporting elements 83.

Membranes 71, 72 and 73 illustrate linear (leg shaped) springs 82 82 that mechanically couple a body 81 to the supporting elements 83. Stators 71, 72 and 73 also illustrate holes 61 that may be used for structure release.

The provision of activation signals to any one of the upper and lower stators and any bias or other signal may be performed in various manners. According to various embodiments there are provided means for reducing unwanted affects of these signals—for example reducing distortions resulting from parasitic or unwanted capacitances.

FIGS. 5-8 illustrate that MEMS electrostatic speaker may include an upper stator contact 93(6) that is electrically coupled to upper stators of multiple cells of the array, a lower stator contact 91(2) that is electrically coupled to lower stators of the multiple cells of the array, and a membrane contact 92(4) that is electrically coupled to membranes of the multiple cells of the array.

The membrane contact 92(4) is supported by a membrane contact support structure 92' that includes (from bottom to top) first insulator 92(1), conducting element 92(2) and second insulator 92(3). The conducting element 92(2) is located at the level of the lower stator and is spaced apart from the lower stator.

The upper stator contact is supported by an upper stator contact support structure 93' that includes (from bottom to top) first insulator 93(1), first conducting element 93(2), second insulator 93(3), second conducting element 93(4), and third insulator 93(5). The first conducting element 93(2) is located at the level of the lower stator and is spaced apart from the lower stator. The second conducting element 93(4) is located at the level of the membrane and is spaced apart from the membrane.

The spacing apart of the conducting elements from the different layers reduces an injection of any of the activation signals to the wrong layer.

The sidewalls or other structural elements should be isolated from the membranes and/or upper stators and/or lower stators. This may prevent or at least reduce the charging of the sidewalls by activation signals fed to the stators and/or bias or other signals fed to the membrane.

Figure 9:
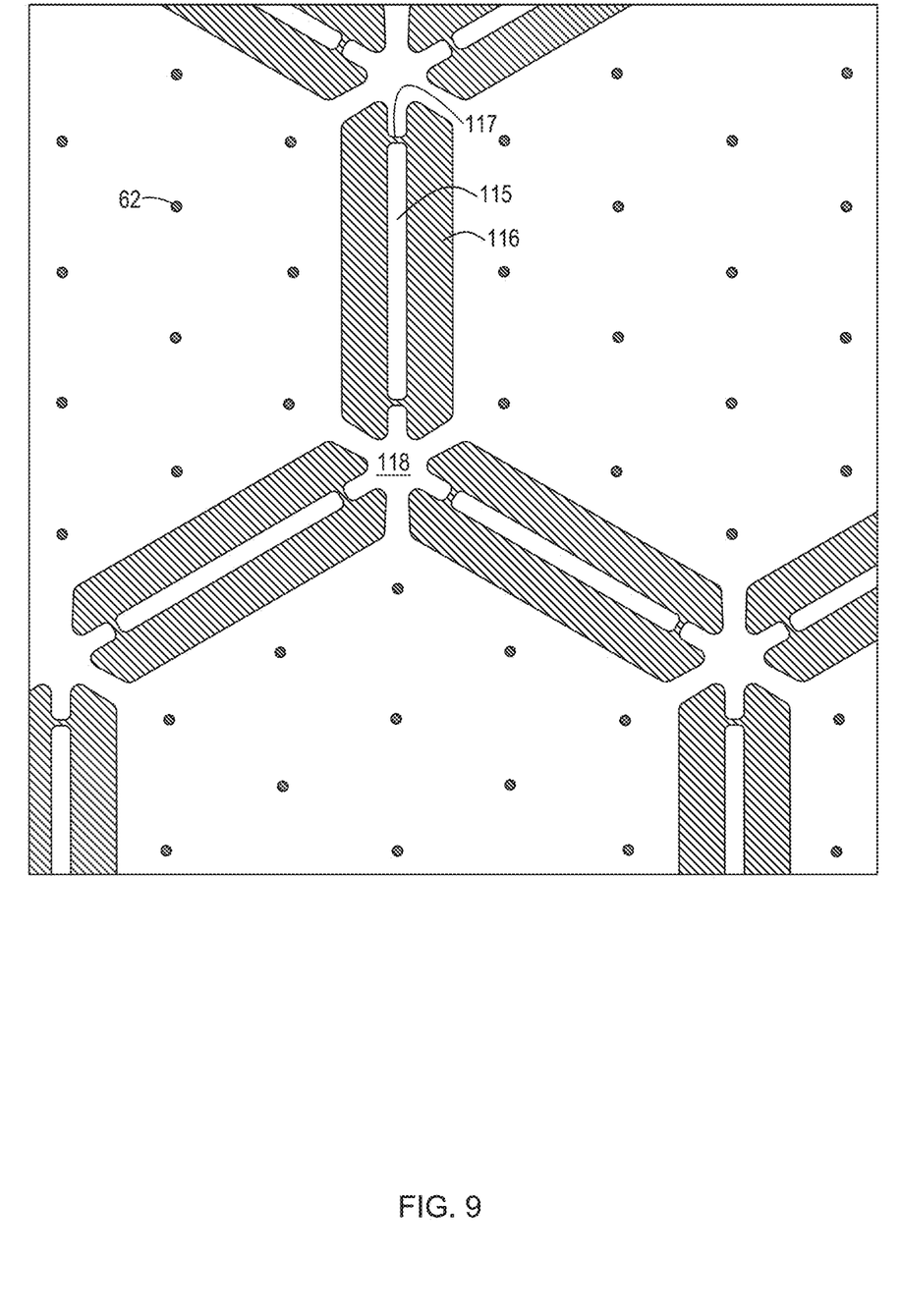
FIG. 9 illustrates parts of cells (membrane) and support structures.

FIG. 9 illustrates multiple membranes of multiple cells, parts of a sidewall 115 that are isolated from the membranes by air gaps 116 and by spacers 117 made of insulating material. Holes 62 are illustrated in the membranes—and may be used as release holes in MEMS process flow. The parts of the sidewalls may be isolated from the membranes in any other manner—for example—they may be completely surrounded by air gaps, completely surrounded by insulating material, and the like.

Figure 10:
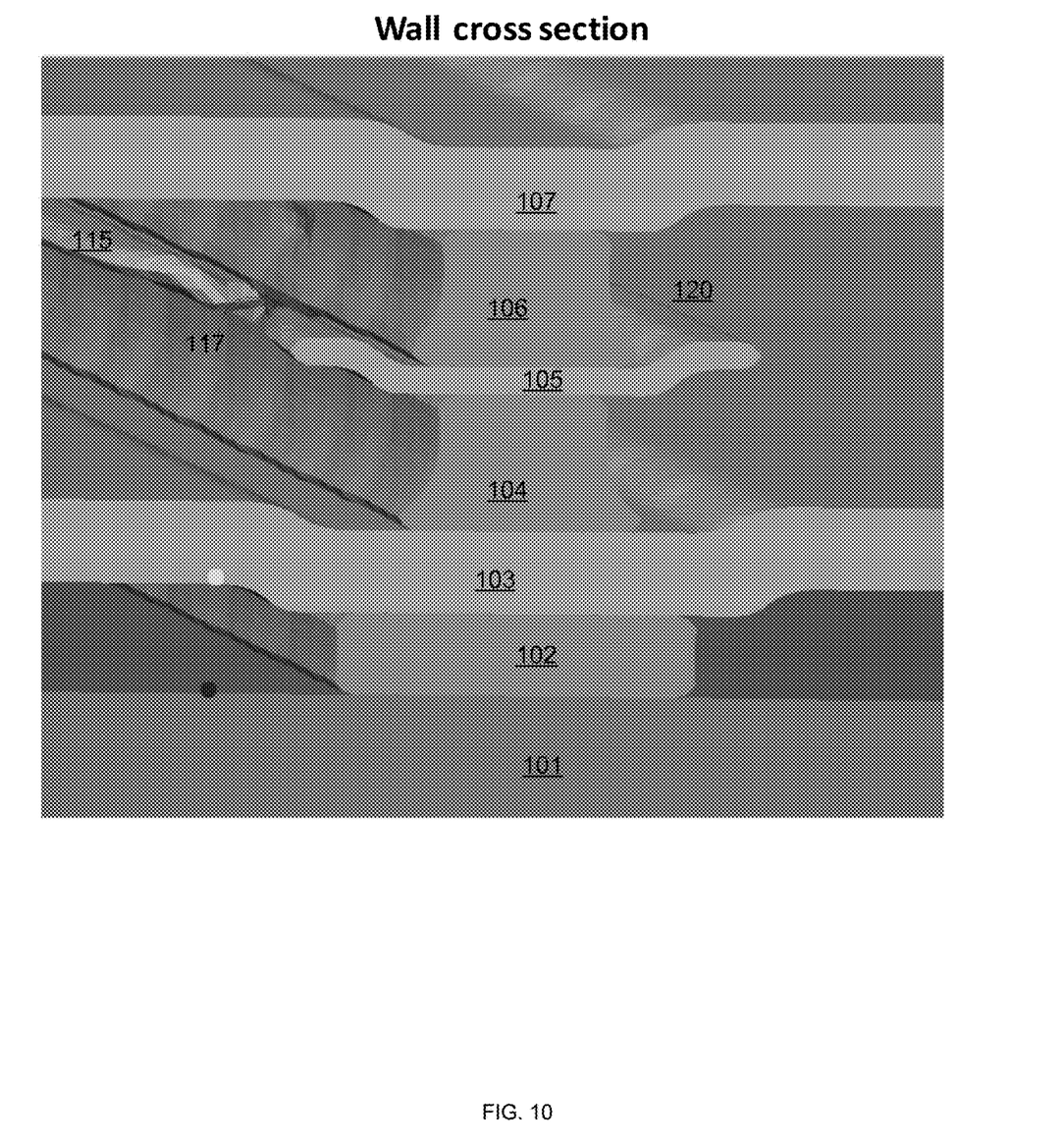
FIG. 10 illustrates a cross section of a part of a cell.

FIG. 10 illustrates an example of a cross section of a cell of a MEMS electrostatic speaker.

The cell of the MEMS electrostatic speaker includes an upper stator, a membrane, a lower stator, supporting elements, a substrate, and electrical components such as insulators and conductors (not shown) for supplying electrical signals—for example one conductor per each one of the upper stator and the lower stator.

The membrane is located between upper stator and the lower stator.

From bottom to top, the MEMS electrostatic speaker includes:
  a. Substrate 101.
  b. First insulator 102.
  c. Lower stator 103.
  d. Second insulator 104.
  e. Membrane 105.
  f Third insulator 106.
  g. Upper stator 107.

In order to reduce the capacitance between the upper stator and any one of the first and/or second conductive elements of the upper stator contact support structure—any of these conductive elements may be apertured (for example—the conductive element is shaped as a frame filled within isolating material).

In order to reduce the capacitance between the membrane contact to the conductive element of the membrane support structure—the conductive element is apertured (for example—the conductive element is shaped as a frame filled within isolating material).

The lower stator and the membrane and/or the membrane and the upper stator may act as plates of a capacitor, whereas sidewalls or any other support element of a cell may form the dielectric material between the plate. In order to reduce the unwanted capacitance of such a capacitor the area of these "plates" may be reduced—for example by forming apertures in the membrane and/or lower stator and/or upper stator at the potential contact area with the sidewalls and/or other structural elements.

Figure 11:
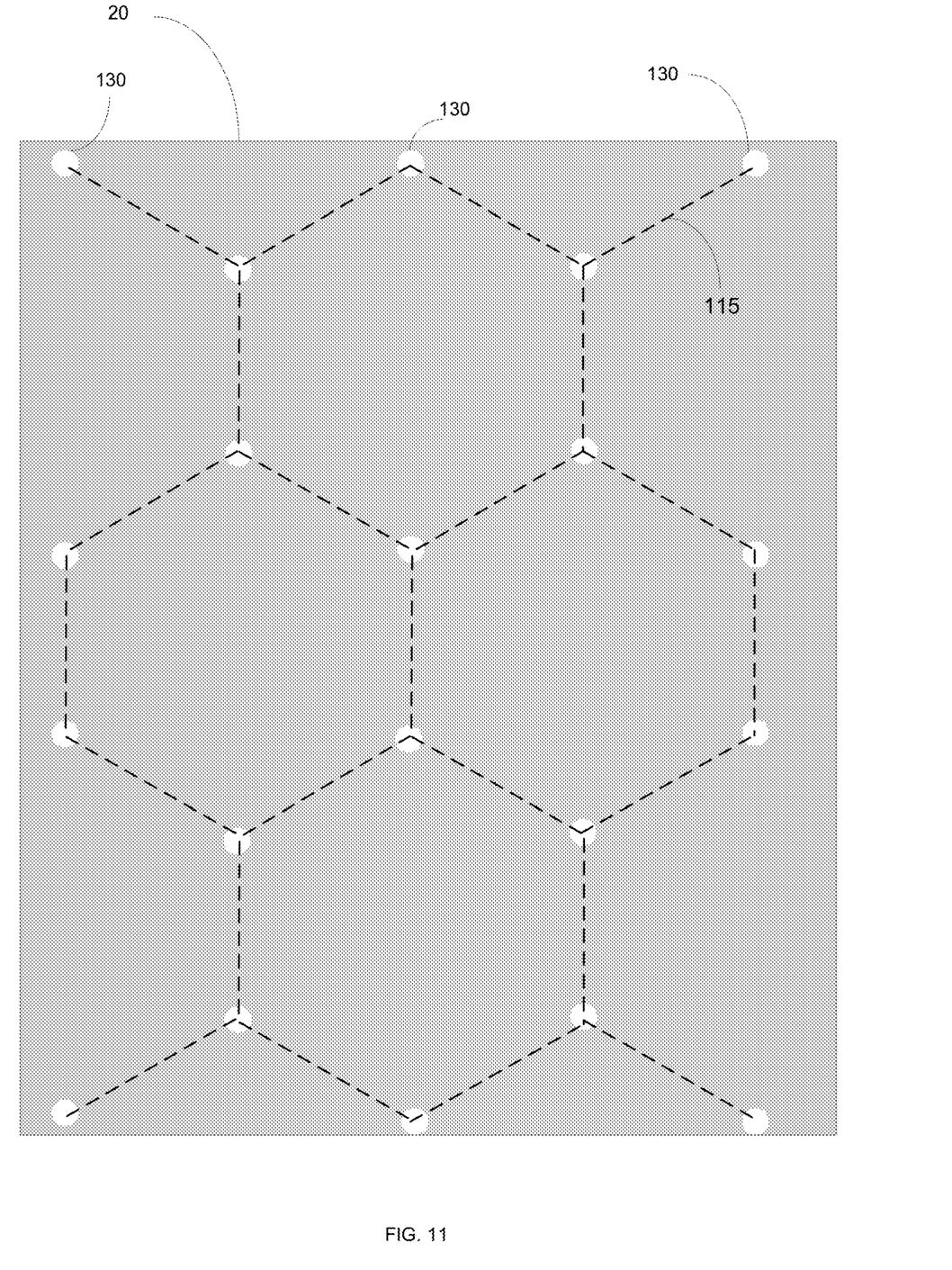
FIG. 11 illustrates parts of cells and support structures.

Such holes 130 are illustrated in FIG. 11. The holes are located above pillars that are connected to multiple sidewalls.

Any of the figures may or may not be in scale.

Figure 12:
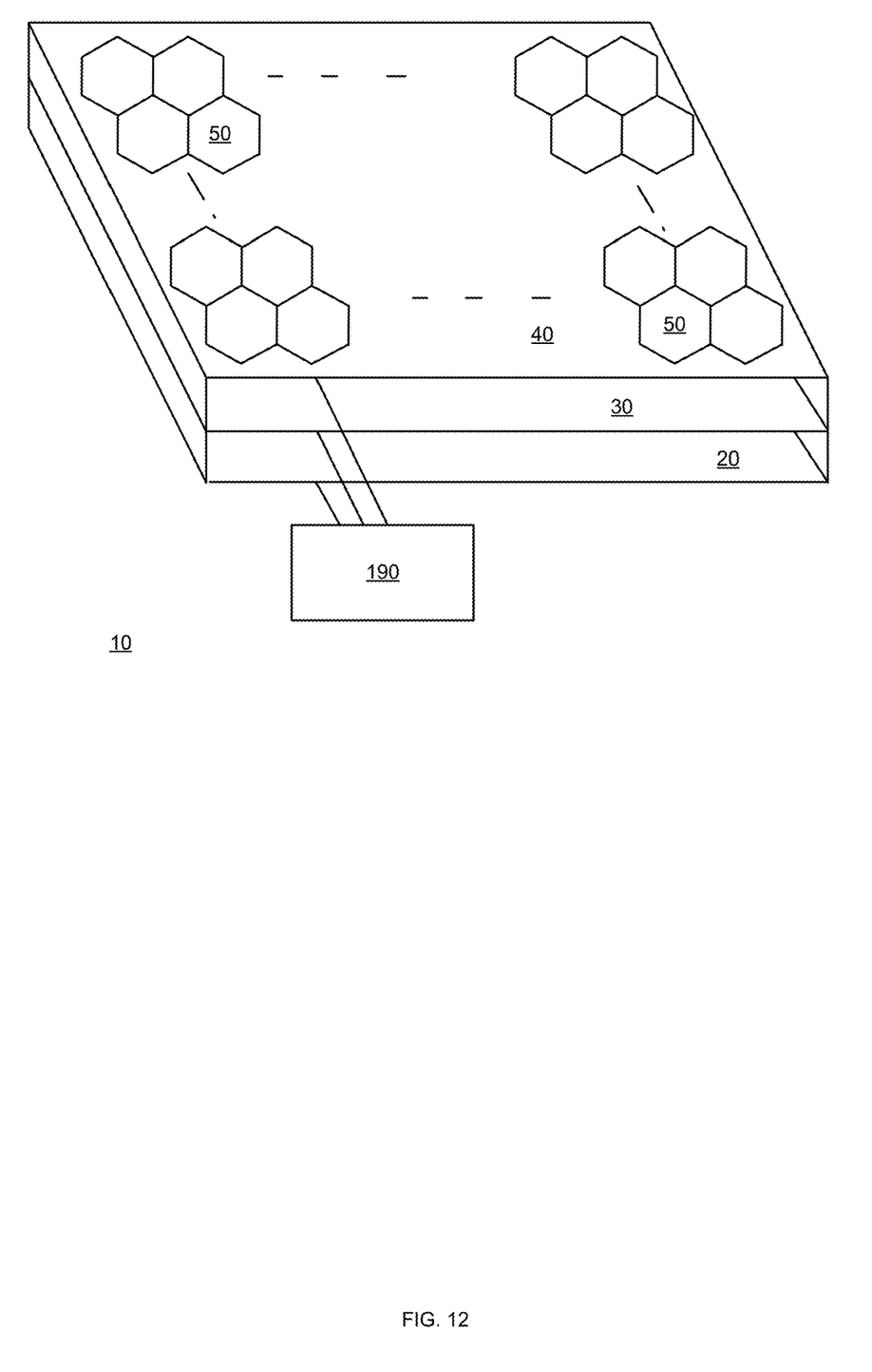
FIG. 12 illustrates an example of a MEMS electrostatic speaker.

FIG. 12 illustrates a MEMS electrostatic speaker 10 that includes an array of cells 50. The upper layer of the MEMS electrostatic speaker 10 includes upper stators 40 of the cells of the array, an intermediate layer of the MEMS electrostatic speaker 10 includes membranes 30 of the cells of the array and a lower layer of the MEMS electrostatic speaker 10 includes lower stators 20 of the cells of the array. There are also supporting elements configured to support the upper stators, the membranes and the lower stators. FIG. 12 also illustrates a signal source for providing activating signals to the upper and lower stators and bias or other signals to the membranes.

It is assumed that the cells are electrically coupled in a parallel manner to each other—but any arrangement may be provided. At least one cell may be fed independently from another cell.

Figure 13:
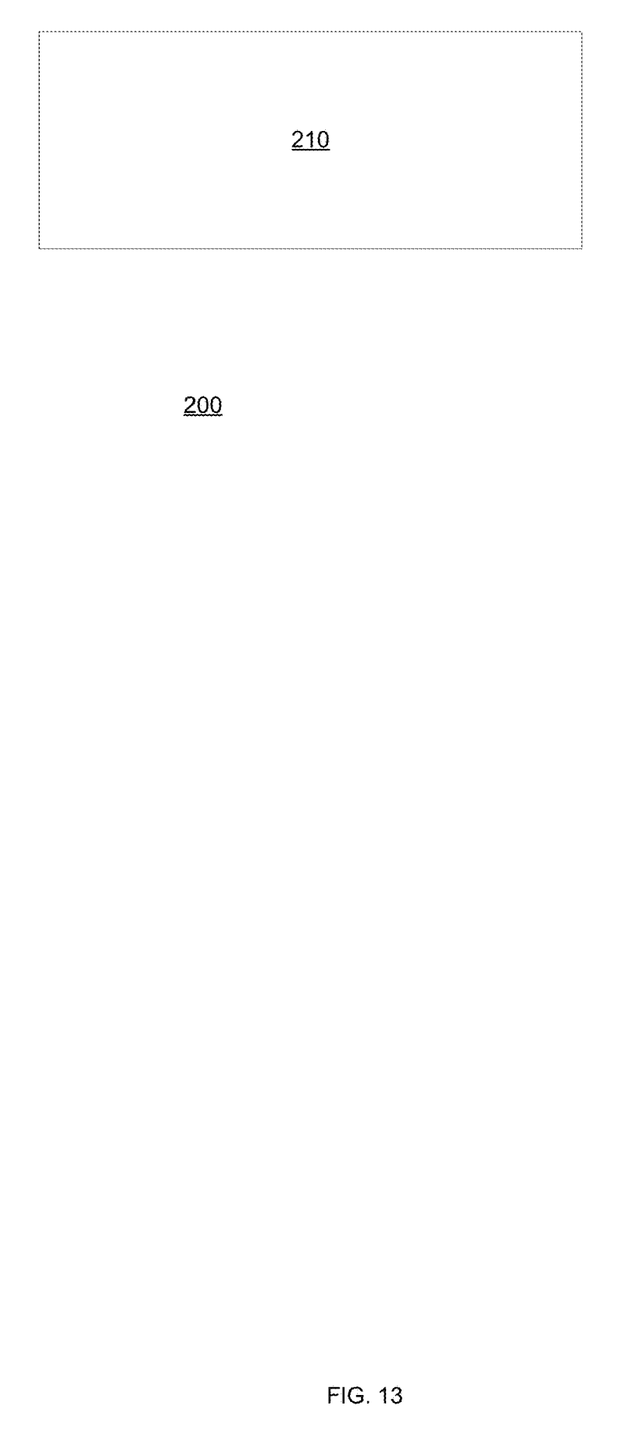
FIG. 13 illustrates an example of a method.

FIG. 13 illustrates method 200.

Method 200 may include step 210 of operating any of the MEMS electrostatic speakers illustrated in the specification.

Step 210 may include supplying activations signals to cells that belong to an array of cells of the MEMS electrostatic speaker, wherein for multiple cells of the array the activation signals are supplied to at least one stator of an upper stator and a lower stator of the cell. The supplying of the activations signals induces membranes of the cells of the array of cells to move between upper stators and lower stators of the cells and generate acoustic signals.

It should be noted that in relation to any of the figures the shape and/or size and/or location of the cell, the array of cells, of each element, of the apertures of each element, the number of apertures, the number of cells per array, and any size illustrated in these figures are merely non-limiting examples.

Any reference to any of the terms "comprise", "comprises", "comprising" "including", "may include" and "includes" may be applied to any of the terms "consists", "consisting", "and consisting essentially of".

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between MEMS elements are merely illustrative and that alternative embodiments may merge MEMS elements or impose an alternate decomposition of functionality upon various MEMS elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single MEMS device. Alternatively, the examples may be implemented as any number of separate MEMS devices or separate MEMS devices interconnected with each other in a suitable manner. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A micro-electro-mechanical system (MEMS) electrostatic speaker that comprises an array of cells, wherein each cell comprises an upper stator, a membrane, a lower stator and supporting elements configured to support the upper stator, the membrane and the lower stator; wherein a distance between the upper stator and the lower stator of each cell is of microscopic scale; wherein for each cell, the membrane comprises a body and springs that couple the body to at least one of the supporting elements.

2. The MEMS electrostatic speaker according to claim 1 wherein a portion of an area of the upper stator is perforated.

3. The MEMS electrostatic speaker according to claim 2 wherein the portion spans along a majority of the area of the upper stator.

4. The MEMS electrostatic speaker according to claim 2 wherein the portion spans along at least ninety percent of the area of the upper stator.

5. The MEMS electrostatic speaker according to claim 2 wherein the portion is perforated with holes of a microscopic range.

6. A micro-electro-mechanical system (MEMS) electrostatic speaker that comprises an array of cells, wherein each cell comprises an upper stator, a membrane, a lower stator and supporting elements configured to support the upper stator, the membrane and the lower stator; wherein a distance between the upper stator and the lower stator of each cell is of microscopic scale; wherein a portion of an area of the upper stator is perforated; and wherein a ratio between (a) an aggregate size of holes and (b) an area of the upper stator ranges between 0.2-0.8.

7. The MEMS electrostatic speaker according to claim 1, wherein for each cell at least some of the supporting elements of the cell are electrically isolated from the membrane.

8. The MEMS electrostatic speaker according to claim 1, wherein for each cell, at a plane of the membrane, at least some of the supporting elements of the cell are surrounded by an air gap.

9. A micro-electro-mechanical system (MEMS) electrostatic speaker that comprises an array of cells, wherein each cell comprises an upper stator, a membrane, a lower stator and supporting elements configured to support the upper stator, the membrane and the lower stator; wherein a distance between the upper stator and the lower stator of each cell is of microscopic scale; and wherein for each cell, at a plane of the membrane, at least some of the supporting elements of the cell are surrounded in part by at least one out of an air gap and a non-conductive material.

10. The MEMS electrostatic speaker according to claim 1, wherein for each cell the supporting elements comprises sidewalls, wherein the sidewalls are isolated from the membrane.

11. A micro-electro-mechanical system (MEMS) electrostatic speaker that comprises an array of cells, wherein each cell comprises an upper stator, a membrane, a lower stator and supporting elements configured to support the upper stator, the membrane and the lower stator; wherein a distance between the upper stator and the lower stator of each cell is of microscopic scale; and wherein for each cell the supporting elements comprises sidewalls that are connected to each other by pillars, wherein at the plane of the lower stator an aperture is formed below the pillar.

12. A micro-electro-mechanical system (MEMS) electrostatic speaker that comprises an array of cells, wherein each cell comprises an upper stator, a membrane, a lower stator and supporting elements configured to support the upper stator, the membrane and the lower stator; wherein a distance between the upper stator and the lower stator of each cell is of microscopic scale; and wherein for each cell the supporting elements comprises sidewalls that are connected to each other by pillars, wherein there is only a partial overlap between the lower stator and the pillar.

13. A micro-electro-mechanical system (MEMS) electrostatic speaker that comprises an array of cells, wherein each cell comprises an upper stator, a membrane, a lower stator and supporting elements configured to support the upper stator, the membrane and the lower stator; wherein a distance between the upper stator and the lower stator of each cell is of microscopic scale; and wherein for each cell the supporting elements comprises sidewalls that are connected to each other by pillars, wherein at the plane of the upper stator an aperture is formed above the pillar.

14. A micro-electro-mechanical system (MEMS) electrostatic speaker that comprises an array of cells, wherein each cell comprises an upper stator, a membrane, a lower stator and supporting elements configured to support the upper stator, the membrane and the lower stator; wherein a distance between the upper stator and the lower stator of each cell is of microscopic scale; and wherein for each cell the supporting elements comprise sidewalls that are connected to each other by pillars, wherein there is only a partial overlap between the upper stator and the pillar.

15. A micro-electro-mechanical system (MEMS) electrostatic speaker that comprises an array of cells, wherein each cell comprises an upper stator, a membrane, a lower stator and supporting elements configured to support the upper stator, the membrane and the lower stator; wherein a distance between the upper stator and the lower stator of each cell is of microscopic scale; wherein the MEMS electrostatic speaker further comprises an upper stator contact that is electrically coupled to upper stators of multiple cells of the array, a lower stator contact that is electrically coupled to lower stators of the multiple cells of the array, and a membrane contact that is electrically coupled to membranes of the multiple cells of the array.

16. The MEMS electrostatic speaker according to claim 1 wherein the springs are linear.

17. The MEMS electrostatic speaker according to claim 1 wherein the springs are nonlinear.

18. The MEMS electrostatic speaker according to claim 1 wherein the springs are S-shaped springs.

19. The MEMS electrostatic speaker according to claim 1 wherein the springs are U-shaped springs.

20. The MEMS electrostatic speaker according to claim 15, wherein for each cell, the membrane comprises a body and springs that couple the body to at least one of the supporting elements.

21. The MEMS electrostatic array according to claim 15 wherein the membrane contact is supported by a membrane contact support structure and wherein the upper stator contact is supported by an upper stator contact support structure.

22. The MEMS electrostatic array according to claim 21 wherein the membrane contact support structure is spaced apart from any lower stator of the array of cells.

23. The MEMS electrostatic array according to claim 21 wherein the upper stator contact support structure is spaced apart from any lower stator of the array of cells and spaced apart from any membrane of the array of cells.

24. The MEMS electrostatic array according to claim 15 wherein at the plane of the lower stator, the contact support structure comprises an apertured portion.

25. The MEMS electrostatic array according to claim 15 wherein at the plane of the lower stator, the contact support structure comprises a conductive frame that surrounds a non-conductive region.

* * * * *